US006247221B1

(12) United States Patent
Ritland et al.

(10) Patent No.: US 6,247,221 B1
(45) Date of Patent: *Jun. 19, 2001

(54) METHOD FOR SEALING AND/OR JOINING AN END OF A CERAMIC FILTER

(75) Inventors: Marcus A. Ritland, Golden; Dennis W. Readey, Lakewood; Richard N. Kleiner, Englewood; Jack D. Sibold, Golden; Kyle Knudson, Lakewood; Steven Landin, Golden; Paul Thoen, Morrison, all of CO (US)

(73) Assignee: Coors Tek, Inc., Golden, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/996,680

(22) Filed: Dec. 23, 1997

Related U.S. Application Data

(63) Continuation-in-part of application No. 08/220,558, filed as application No. PCT/US93/08835 on Sep. 17, 1993, now Pat. No. 5,700,373, which is a continuation-in-part of application No. 07/946,972, filed on Sep. 17, 1992, now abandoned.

(51) Int. Cl.[7] .............. B23P 25/00; B23P 17/00; B23P 17/02; B22D 19/04
(52) U.S. Cl. ............ 29/458; 29/527.2; 29/527.5; 164/97; 164/102; 228/120; 228/903
(58) Field of Search .................. 210/510.1, 450, 210/496, 500.1, 497.01, 456, 493.2, 323.2, 446, 500.26, 503, 506; 55/523, DIG. 30, 502; 228/120, 903; 164/91, 97, 98, 101, 102; 419/10, 19, 22, 30, 31; 29/458, 527.2, 527.5

(56) References Cited

U.S. PATENT DOCUMENTS

| | | |
|---|---|---|
| 4,069,157 | 1/1978 | Hoover et al. .............. 210/433 |
| 4,155,980 | 5/1979 | Santiago et al. . |
| 4,278,639 | 7/1981 | Tadokoro et al. . |
| 4,363,644 * | 12/1982 | Soto et al. .................. 55/523 |
| 4,417,908 * | 11/1983 | Pitcher, Jr. .............. 210/510.1 |
| 4,683,207 | 7/1987 | Waarvik . |
| 4,894,160 * | 1/1990 | Abe et al. .............. 210/510.1 |
| 4,971,696 | 11/1990 | Abe et al. ................. 210/500 |
| 4,981,590 | 1/1991 | van 'T Veen et al. ........ 210/490 |
| 4,983,423 | 1/1991 | Goldsmith ................. 427/230 |
| 5,004,034 | 4/1991 | Park et al. ................ 164/97 |
| 5,040,588 | 8/1991 | Newkirk et al. ............ 164/97 |
| 5,161,728 * | 11/1992 | Li .......................... 228/124 |
| 5,203,488 | 4/1993 | Wang et al. .............. 228/122 |
| 5,223,138 * | 6/1993 | Zievers et al. ............. 55/523 |
| 5,238,045 | 8/1993 | Park et al. ................ 164/97 |
| 5,248,079 * | 9/1993 | Li .......................... 228/121 |
| 5,249,621 | 10/1993 | Aghajanian et al. ........ 164/97 |
| 5,400,947 * | 3/1995 | Wang et al. ............ 228/124.5 |
| 5,401,406 * | 3/1995 | Johnson et al. ........... 210/450 |
| 5,415,772 * | 5/1995 | Garcera et al. .......... 55/DIG. 30 |
| 5,534,308 | 7/1996 | Bamberg et al. ........... 427/454 |
| 5,700,373 * | 12/1997 | Ritland et al. ........... 210/323.2 |
| 5,735,332 * | 4/1998 | Ritland et al. ............ 164/98 |

FOREIGN PATENT DOCUMENTS 0197694   10/1986   (EP) .
463234 *  1/1992   (EP) .................. 210/510.1

OTHER PUBLICATIONS

Goetzel, "Infiltration," *Metals Handbook,* (Powder Metallurgy) 7:551–566 (1984).
Nifterik, Supersterke Metaalmatrixcomposiet Wordt Betaalbaar Met Nieuw Procede 10426 Polytechnish Weekblad (1991), Rijswijk, Netherlands (with translation).

* cited by examiner

Primary Examiner—Jan H. Silbaugh
Assistant Examiner—Michael I. Poe
(74) Attorney, Agent, or Firm—Sheridan Ross P.C.

(57) ABSTRACT

A process for sealing a ceramic filter by infiltrating a metal into an end of the filter. The process includes the steps of contacting the end of a porous ceramic filter with a molten metal, whereby the metal enters into the ceramic matrix to substantially fill the void space. The ceramic filter is cooled to form a filter having a ceramic-metal composite portion. The present invention also provides a filter having an infiltrated metal seal. Methods for joining infiltrated ends are also provided.

18 Claims, 6 Drawing Sheets

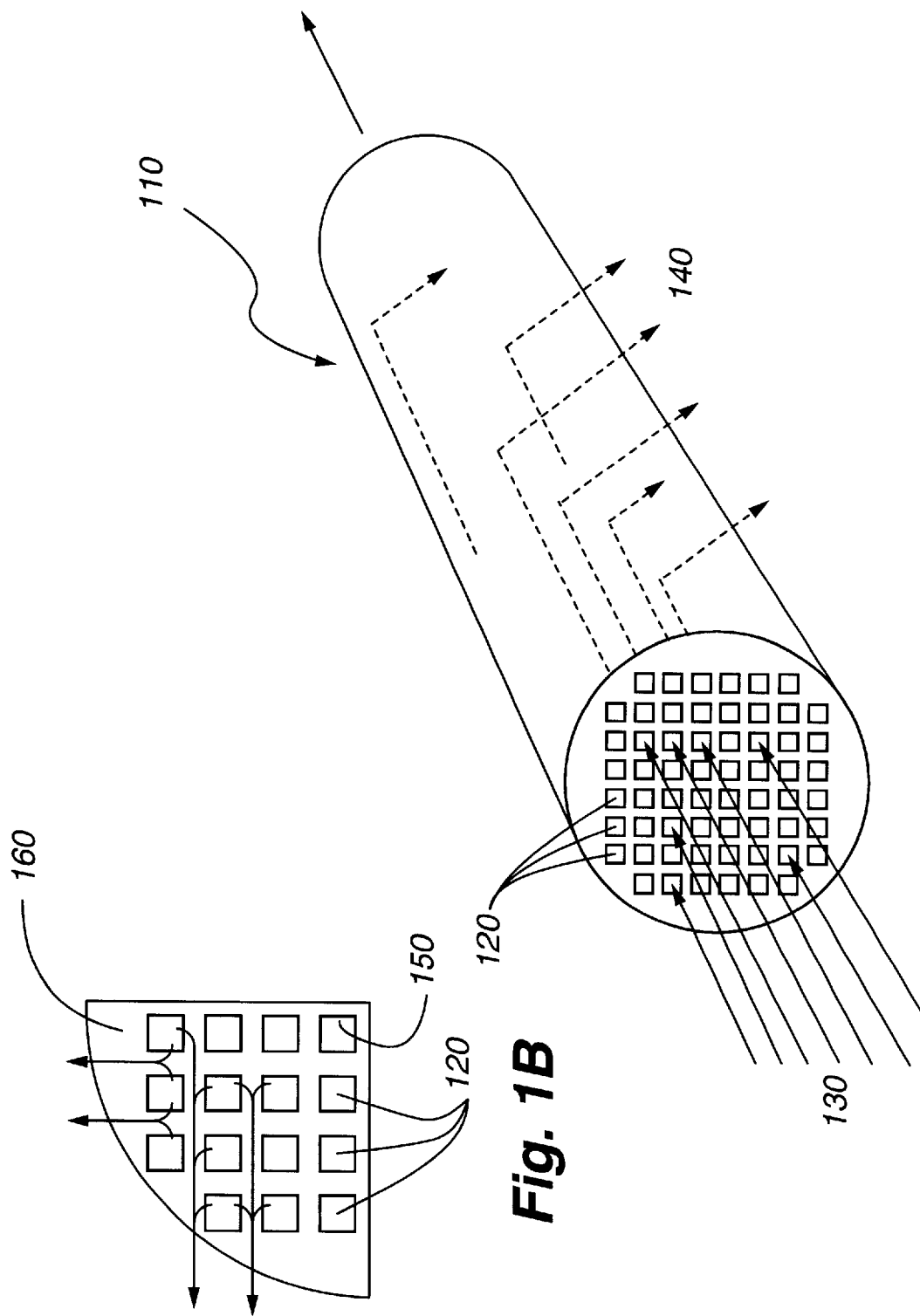

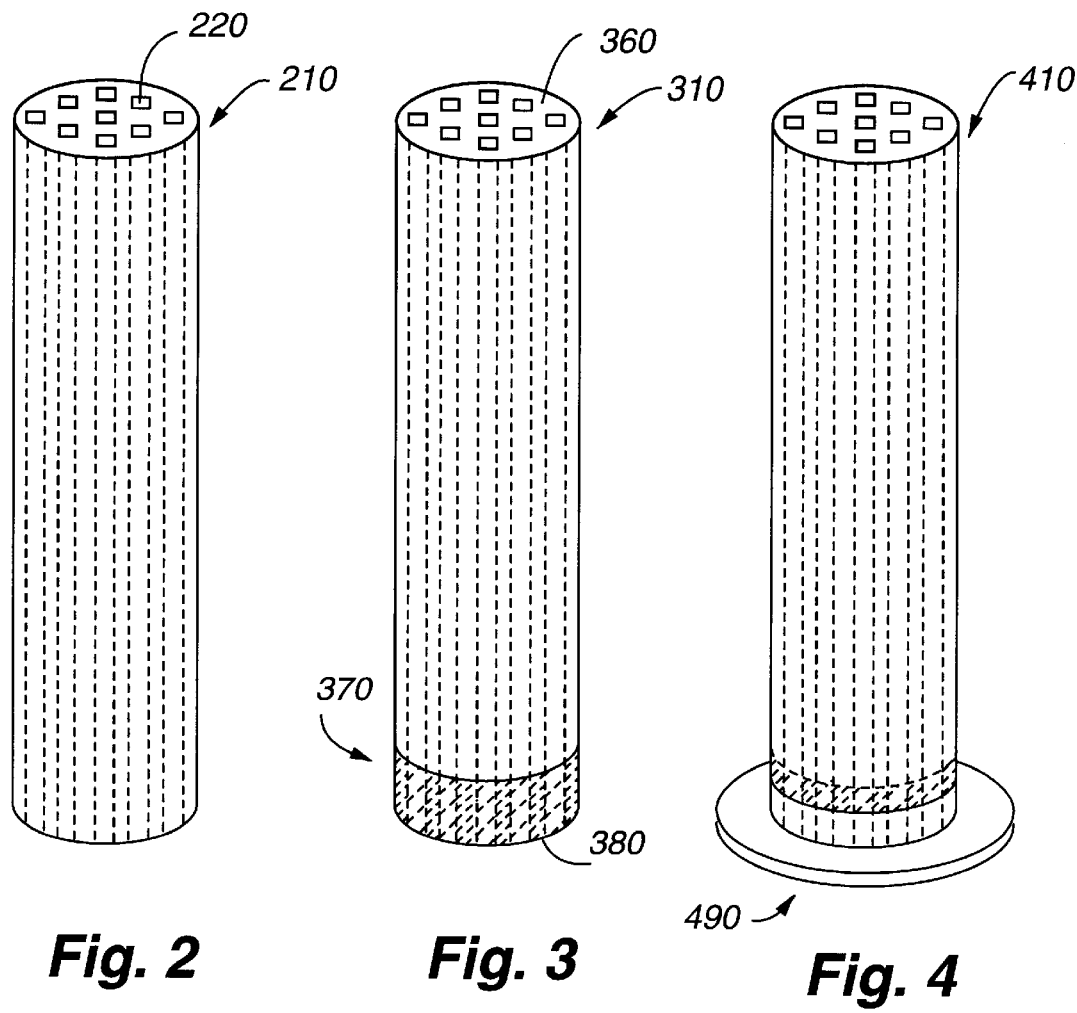

METHOD FOR SEALING AND/OR JOINING AN END OF A CERAMIC FILTER

CROSS-REFERENCE TO RELATED APPLICATIONS

This application is a continuation-in-part of U.S. patent application Ser. No. 08/220,558, filed Mar. 31, 1994, now U.S. Pat. No. 5,700,373, issued on Dec. 23, 1997, which is a continuation-in-part of Patent Cooperation Treaty Application No. PCT/US93/08835, filed Sep. 17, 1993, which designates the United States and is a continuation-in-part of U.S. patent application Ser. No. 07/946,972, filed Sep. 17, 1992, now abandoned.

FIELD OF THE INVENTION

The present invention relates to a method for sealing and/or joining an end of a porous ceramic, preferably a ceramic filter element. More particularly, the present invention relates to a method for sealing and/or joining the end of a ceramic filter element by infiltrating metal into a portion of the filter element. The present invention also relates to filter elements produced by infiltrating metal into an end to seal the filter element, and to connecting devices for connecting such filter elements to a dissimilar material or together.

BACKGROUND OF THE INVENTION

Filtration devices are used to separate two or more substances from each other on the basis of chemical or physical properties of the substances. Filtration devices can rely upon a chemical potential differential across a porous membrane for separating the substances. There has been significant interest in a range of filtration devices that can be categorized into groups including: (1) dense membranes in which materials diffuse through grain boundaries; (2) micropores (from about 3 to about 20 angstroms); (3) nano-filtration (from about 10 to about 80 angstroms); (4) ultra-filtration (from about 0.001 to about 0.2 micrometers); and micro-filtration (from about 0.2 to about 10.0 micrometers).

These filtration devices are particularly useful for separating substances from gas streams or liquids. A number of separation methods have been used in the various processing industries. The use of filtration devices having ceramic membranes is a relatively new area. The benefits of ceramic membranes generally include high-temperature capability, resistance to chemicals and good structural integrity which permits the separation membrane to be used under high pressures.

Ceramic membranes can be used for a wide variety of applications. For example, clarifying and sterilizing fruit juices and other liquids in the food and beverage industry; concentrating vaccines and enzymes or purifying amino acids and similar processes in the biotechnology industry; removing hydrogen from refinery streams and carbon dioxide and hydrogen sulfide from natural gas in the gas separation industry; separating oxygen from air; removing precipitated radionuclides and metal oxide and metal hydroxide particles from waste water; and purifying waters, acids, solvents and similar liquids in the electronic manufacturing industry.

Ceramic-based filter elements have been developed to take advantage of the properties of ceramic materials. For example, a filtration device having a ceramic filter element is disclosed in U.S. Pat. No. 4,069,157 by Hoover et al., which is incorporated herein by reference in its entirety. This patent discloses a filter element fabricated using a porous ceramic support, such as alumina ($Al_2O_3$) or cordierite ($2MgO \cdot 2Al_2O_3 \cdot 5SiO_2$), having a porosity of from about 30 percent to about 60 percent. A ceramic membrane layer is coated onto the interior channels of the porous ceramic support. The opening size in the membrane is controlled and can vary from about 0.002 micrometers up to about 1 micrometer.

Similar filtration devices utilizing ceramic filter elements are disclosed in the prior art. For example, see U.S. Pat. Nos. 4,894,160 and 4,971,696, both by Abe et al.; U.S. Pat. No. 4,983,423 by Goldsmith; or U.S. Pat. No. 4,981,590 by Van Tveen. Each of the foregoing patents is incorporated herein by reference in their entirety.

One of the problems associated with manufacturing filtration devices incorporating ceramic filter elements is the difficulties and limitations relating to sealing the end of the ceramic filter element. At least one end of the filter element must usually be sealed and prepared for installation into a filtration device by sealing the porous support and providing a surface that can easily be attached to the filtration device. Typically, the end of the filter must form a tight seal with a metal component, such as a stainless steel ring, to prevent the pressurized filtrant from bypassing the filter. Most filter elements have been sealed by internally sealing the porous ceramic with a ceramic slurry or cement and using organic materials, such as rubber or polymer "o-rings" to seal around the perimeter of the filter element. The o-rings are typically not capable of functioning in elevated temperatures and under corrosive conditions. Further, the o-rings will not form a tight seal around the ceramic if the perimeter of the ceramic filter element has defects or is "out of round." This is a particularly acute problem when the filter is used to separate materials having very small diameters (e.g. ultrafiltration).

U.S. Pat. No. 5,203,488 by Wang et al. issued on Apr. 20, 1993. This patent is assigned to LANXIDE Technology Co. and is part of a series of patents assigned to LANXIDE Technology Co. that relate to ceramic-metal composites. Wang et al. disclose a method for joining two self-supporting bodies by a reactive infiltration process. It is disclosed that two materials can be bonded together utilizing the composite of the invention. For example, a powdered parent metal and a material which is to be reactively infiltrated can be placed between the two bodies. In an alternative embodiment, it is disclosed that an active brazing material can be placed between two composites formed according to the invention or may be placed between one body formed in accordance with the invention and a second body. It is disclosed that a foil, paste or powder which includes an active brazing alloy is placed between at least two self-supporting bodies made according to the first step of the invention.

SUMMARY OF THE INVENTION

The present invention is generally directed to a method for sealing and/or joining an end of a porous ceramic and preferably a ceramic-based filter element.

According to one aspect of the present invention, a method for sealing the end of a ceramic filter element is provided. The method can include the steps of providing a porous ceramic filter element having a first end and a second end and having filtering channels therethrough, contacting a portion of the first end of the filter element with a molten metal to infiltrate the metal into the first end of the filter element and cooling the infiltrated portion to form a filter element having a sealed end comprising a ceramic-metal composite portion.

According to certain embodiments of this aspect of the invention, the method can include the step of attaching a metal seal ring to the ceramic-metal composite portion. The step of attaching a metal seal ring to the ceramic-metal composite portion can include the step of brazing or welding a seal ring to the ceramic-metal composite portion. According to another embodiment, the ceramic filter element can include porous alumina having an open porosity of from about 30 volume percent to about 50 volume percent and the metal can include copper metal. The copper metal can also include an infiltration additive, such as oxygen. When oxygen is used as an infiltration additive, it is preferably added in an amount from about 1.5 weight percent to about 10 weight percent. The porous ceramic support can have an average pore size of from about 0.01 micrometers to about 2 millimeters, preferably from about 2 micrometers to about 15 micrometers, more preferably from about 6 micrometers to about 12 micrometers.

In another embodiment of this aspect of the invention, the method can further include the step of attaching a connecting means to the ceramic-metal composite portion. In one embodiment, such a connecting means permits sealable attachment of the porous ceramic element to a dissimilar material. In another embodiment, such a connecting means permits sealable attachment of one porous ceramic element to another porous ceramic element. In further embodiments, such a connecting means can include a swage fitting, a compression fitting, a weld, a braze, a metal bellows and/or threads which are formed on the ceramic metal composite portion.

According to another aspect of the present invention, a method for sealing the end of a ceramic-based filter element is provided. The method can include the steps of placing a metal in a refractory vessel, heating the metal to a temperature in excess of the melting temperature of the metal such that the metal is in the form of a molten pool having a top surface, contacting a cylindrical ceramic filter element having a first end and a second end and a plurality of channels therethrough with the top surface of the molten pool for a time sufficient to infiltrate a portion of the sintered ceramic filter element, removing the sintered ceramic filter element from contact with the molten pool, cooling the metal-infiltrated portion to form a ceramic filter element having a ceramic-metal composite portion and attaching a metal seal ring to the ceramic-metal composite portion.

According to certain embodiments of this aspect of the invention, the attaching step can include the step of brazing a seal ring to a ceramic-metal composite with a brazing alloy. The brazing alloy can include a copper-silver alloy. In one embodiment, the metal seal ring is a stainless steel ring. In other embodiments, the metal seal ring can be made from other metals, including but not limited to, Kovar™ and carbon steel.

According to another aspect of the present invention, a method for sealing the end of a porous ceramic filter element is provided. This method can include the steps of providing a porous ceramic filter element having a first end and a second end and comprising a plurality of channels therethrough, providing a metal seal ring located around the perimeter of the first end of the filter element, contacting the first end of the filter element with a molten reactive braze metal to infiltrate a portion of the first end with the reactive braze metal and cooling the reactive braze metal to form a seal between the filter element and the seal ring. Preferably, the reactive braze metal is selected from the group comprising titanium, copper, nickel, silver and alloys thereof.

In yet another aspect of the present invention, a ceramic filter element for a filtration device is provided. The ceramic filter element includes a substantially cylindrical ceramic porous support having channels therethrough, a membrane layer coated on at least a portion of said channels in said porous ceramic support and a metal infiltrated into a portion of the cylindrical ceramic filter element to form a ceramic-metal composite therein.

In another embodiment of the present invention, the ceramic filter element has a tubular configuration. The tubular configuration is made up of a central channel surrounded by a porous sidewall. The substance to be filtered can be passed adjacent either the inner or outer wall of the tubular porous sidewall and the filtered material passes through the porous sidewall to the other side for collection.

According to certain embodiments of this aspect of the invention, the filter element includes alumina ceramic. The filter element can have an open porosity of from about 30 volume percent to about 50 volume percent. Further, the filter element can include a stainless steel ring attached to the ceramic-metal composite portion.

In other embodiments of this aspect of the invention, the filter element further includes a connecting means that is attached to the ceramic-metal composite portion. In further embodiments, such a connecting means can include a swage fitting, a compression fitting, a weld, a braze, a metal bellows and/or threads which are formed on the metal composite portion for screwing the ceramic filter element into a threaded member.

BRIEF DESCRIPTION OF THE DRAWINGS

FIGS. 1A and 1B illustrates a ceramic filter element according to one embodiment of the present invention.

FIG. 2 illustrates a ceramic filter element according to one embodiment of the present invention.

FIG. 3 illustrates a ceramic filter element according to one embodiment of the present invention that has been infiltrated with a metal to seal an end of the filter.

FIG. 4 illustrates a filter element according to one embodiment of the present invention that has been infiltrated with a metal to seal an end of the filter and has a metal ring brazed to the sealed end.

DESCRIPTION OF PREFERRED EMBODIMENTS

Figure 5A:
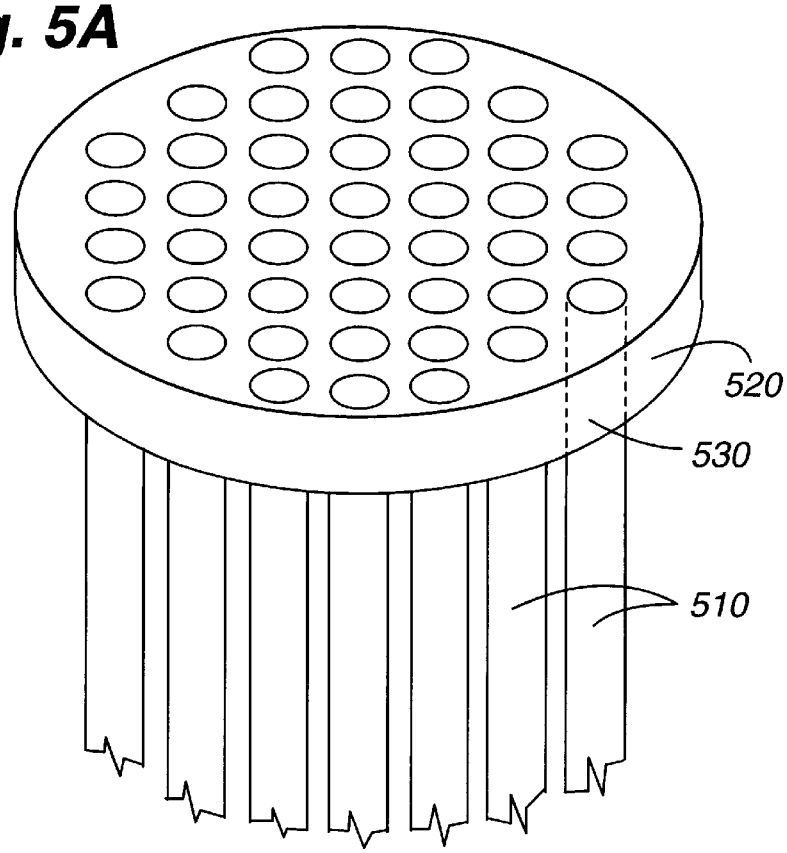
FIG. 5A illustrates a plurality of ceramic filter elements according to one embodiment of the present invention that are connected to a tube sheet header.

The present invention is directed to a method for sealing the end of a porous ceramic element, preferably ceramic filter element, by infiltrating a metal into the end of the filter element to form a ceramic-metal composite at the end. The composite at the end of the filter element creates a substantially hermetic seal within the porous support and a metal ring can be attached to the composite in preparation for placement into a filtration device.

Ceramic filter elements typically have a cylindrical configuration, such as that illustrated in FIG. 1, although other configurations are possible. Referring to FIG. 1, a cross-flow filter element 110 is illustrated as a cylinder including a plurality of channels 120 that run through the length of the filter element 110 and are substantially parallel to the cylinder and one another. The filter element can be open at both ends or one end can be closed. During use, the substance to be filtered passes into a first (upstream) end 130 of the filter element 110 and a portion of the filtrate passes through the sidewalls 140 of the filter element 110 due to a pressure differential.

As is illustrated by the cut-away portion of FIG. 1, the channels 120 are preferably coated on their interior surface 150 with a membrane. Thus, before the filtrate reaches the porous support 160 of the filter element 110, the filtrate must pass through the membrane layer coated on the walls of 150 of the channels 120.

The ceramic porous support can be chosen from any of a number of metal oxides, carbides, nitrides or the like. For instance, the ceramic can comprise alumina ($Al_2O_3$), cordierite ($2MgO \cdot 2Al_2O_3 \cdot 5SiO_2$), titania ($TiO_2$), zinc oxide (ZnO), zirconia ($ZrO_2$), iron oxide ($Fe_2O_3$), magnesia (MgO), silica ($SiO_2$), or any other metal oxide. Further, non-oxide ceramics such as silicon carbide (SiC), silicon nitride ($Si_3N_4$), aluminum nitride (AlN) or titanium diboride ($TiB_2$) can be used as the ceramic support material. According to one embodiment of the present invention, alumina is preferred since porous alumina supports can be easily formed and processed into various shapes. Further, alumina maintains good strength and structural integrity in a variety of conditions.

The porous support of the ceramic filter element is a sintered, coherent ceramic body that has substantially continuous open porosity. The porous support preferably has an apparent open porosity of from about 10 volume percent to about 90 volume percent, more preferably from about 30 volume percent to about 50 volume percent. The open porosity preferably has an average apparent diameter of from about 0.01 micrometers to about 2 millimeters, preferably from about 2 micrometers to about 15 micrometers, more preferably from about 6 micrometers to about 12 micrometers.

The porous support can be formed in a number of ways known to those skilled in the art. For example, porous ceramics can be formed by incorporating pore formers into the ceramic batch. Pore formers are materials that have a volatilization temperature that is lower than the sintering temperature of the ceramic. Upon sintering, the material volatilizes, leaving behind open pore space. Examples of such materials include walnut shells and latex spheres.

Porous ceramics can also be produced by controlling the starting particle size of the ceramic raw materials, the sintering aids and the sintering temperature used to densify the ceramic. For example, porous alumina can be formed by blending alumina particles having particle size of about 10 micrometers. The particles are formed into a cohesive plastic mass and extruded through a die to form a green body having channels therethrough. The green body is then sintered for a period of time to form a sintered ceramic porous support. The sintering temperature is somewhat below the normal sintering temperature for obtaining dense alumina so that a porous structure can be obtained.

The porous support has at least one channel running through the interior of the filter and preferably has a plurality of channels. The channels can be formed by a number of techniques known to those skilled in the art, such as incorporating temporary channel molds that are removable after sintering or forming the channels during extrusion of the ceramic body out of an extrusion die.

After sintering, the ceramic porous support can then be treated to adhere one or more membrane layers to the channels of the porous support to form a filter element. The membrane layers are the primary filtering layers for separation of materials. A membrane layer typically includes a dispersion of particles having a controlled particle size and particle size distribution. The particles can be dispersed in a liquid medium which is slip cast, dip-coated or spray-coated onto the channels of the porous ceramic support. The membrane particles can have a similar ceramic composition as the porous support or can have a different composition. It is preferred, however, that the membrane layer be made from ceramic materials to maintain corrosion and heat resistance. The porosity and pore size of the membrane is controlled by the size of the membrane particles and the temperature and time of sintering after the porous support is coated with the membrane.

The membrane layer can include a plurality of layers having different particle sizes for different applications. Each individual layer can be applied, for example, by immersing the tube in a liquid suspension and drawing a vacuum through the inner diameter of the tube. Alternatively, the slurry containing the membrane particles can be pumped through the tube under pressure or can be slip-cast into the tube.

According to one preferred embodiment of the present invention, the membrane includes three different layers. A first layer is applied to the channels by slip-casting a slurry having alumina particles with an average diameter of about 3 micrometers and this layer is sintered at about 1430° C. to form an adhered first layer having an average pore size of about 0.8 micrometers. A second layer is then applied by slip-casting alumina particles onto the first layer having an average particle size of about 0.5 micrometers. This layer is sintered at about 1000° C. to form a second adhered layer having an average pore size of about 0.2 micrometers. Finally, a third layer can be applied as a sol-gel and can be sintered at about 650° C. to form a third layer having an average pore size of, for example, about 40 angstroms.

According to the present invention, when a filter element having the desired properties is obtained, molten metal can be infiltrated into the open porosity of the filter element to internally seal the filter element. The metal infiltrates the porous support without substantially clogging or filling the filter channels. The metal can be infiltrated into the ceramic filter element either before or after the membrane layer has been adhered to the porous support. It may be advantageous to infiltrate the metal into the filter element before applying the membrane layers since the molten metal may preferentially infiltrate the membrane layer due to the smaller pore size of the porosity in the membrane layer and because the infiltration temperature can be hotter than the sintering temperature of the membrane layer.

The infiltrant metal can be selected from any metal whose melting point is below the melting point of the ceramic matrix material. For example, copper (Cu), nickel (Ni), aluminum (Al), silver (Ag) or alloys thereof can be used for the infiltrating metal. A preferred metal is copper, since it has been found that copper alloy readily infiltrates into an alumina ceramic filter element. Other metals may be preferred, depending on the anticipated end use of the filter.

In a preferred embodiment of the present invention, an end of the ceramic filter element is brought into contact with the molten metal and the metal infiltrates the ceramic by capillary action without the assistance of any substantial overpressure. As used herein, the term "substantial overpressure" refers to a pressure in excess of about 3 atmospheres (about 45 psi) applied during the infiltration process, either mechanically or through the use of pressurized gas.

Upon infiltration, the molten metal enters the pore structure of the ceramic filter element and fills substantially all of the void space, up to a certain height. The distance that the metal infiltrates into the filter element can be controlled by controlling the amount of molten metal that is available to infiltrate or by controlling the amount of time that the filter element is in contact with the molten metal or by controlling the alloy composition, and in particular the oxygen level for a copper alloy.

Infiltration additives can also be used when such additives are not substantially detrimental to the resulting seal in the filter element. For example, to improve capillary action between the ceramic and the molten metal, it may be desirable to modify the wetting or spreading characteristics of the ceramic and metal. One way to do this is to coat the open porosity of the ceramic filter element with a coating that is more easily wetted by the molten metal. For instance, the surfaces of alumina or magnesia ceramic can be modified by vapor phase coating the ceramic with copper oxide or nickel oxide to enhance the infiltration of copper metal into the porous support.

Another way of enhancing the wetting characteristics is to modify the chemical composition of the molten metal with an infiltration additive. For instance, the wetting of molten copper on alumina can be enhanced by the addition of oxygen to the copper. Such additions enhance the wetting and permit infiltration to occur rapidly and easily. When oxygen is added, it is preferred to add the oxygen to the copper metal in an amount of from about 1.5 weight percent to about 10 weight percent, more preferably from about 2 weight percent to about 5 weight percent.

After one or more of the surface modifications and chemical modification noted above, if necessary, the molten metal will wet the ceramic and infiltrate the open porosity of the ceramic filter element through capillary action.

Although a vacuum atmosphere is not necessary, the metal infiltration step is preferably performed in a vacuum atmosphere. As used herein, vacuum atmosphere refers to an atmospheric pressure of about 10 millitorr or less. The evacuation of air from the ceramic void space reduces the likelihood that air pockets will be entrapped in the composite.

The temperature at which infiltration takes place is dependent on the ceramic and molten metal used. In one embodiment, an alumina ceramic with a 3 micrometer average pore size is infiltrated at 1250° C. with copper having about 3 weight percent oxygen added as an infiltration additive. The total time required for infiltration of a filter element is very short and can typically occur in less than about 1 minute.

The filter element is preferably heated to at least the melting temperature of the infiltrant metal prior to infiltration. If the ceramic filter element is too cool, the molten metal may selectively solidify as it infiltrates the ceramic filter element and may prevent further infiltration due to the solidification.

After the metal has been infiltrated into an end of the filter element and has cooled, the filter element can then be connected to a supporting metallic ring. For example, it is often necessary to connect the filter element to a supporting stainless steel ring which is later connected to the filtration apparatus.

According to one embodiment of the present invention, the metal infiltrated filter element is brazed to a metal ring, such as a stainless steel ring. The metal ring is brought into proximity with the filter element such that the ring surrounds the ceramic-metal composite portion and a braze metal is placed between the stainless steel ring and the composite portion. When the braze is heated, it wets both the stainless steel ring and the ceramic-metal composite portion and, upon cooling, forms a tight hermetic bond to both articles. According to one embodiment of the present invention, the infiltrated metal is copper metal, the ring is stainless steel and the braze is a copper/silver brazing alloy.

In an alternative embodiment of the present invention, a reactive braze is infiltrated into the ceramic filter element such that the reactive braze simultaneously adheres to the stainless steel ring. For example, a copper/silver/titanium alloy can be heated to above its melting point and infiltrated into the ceramic while the metal ring is placed around the filter element. Upon cooling, a hermetic seal is formed between the metal ring and the metal-infiltrated ceramic.

The foregoing embodiments are generally illustrated in FIGS. 2–4. FIG. 2 illustrates a filter element 210 according to the present invention. The filter element 210 includes a plurality of filtering channels 220 extending through the length of the filter element 210. FIG. 3 illustrates a filter element 310 wherein the porous support portion 360 has been infiltrated at the lower end 370 with a metal 380. Although, as illustrated in FIG. 3, it appears that the metal is discontinuous, the metal is in fact continuous and forms a solid surface around the perimeter of the filter element 310. However, the molten metal does not enter the channels 220, which remain free of obstruction.

FIG. 4 illustrates the filter element 410 wherein a ring 490 has been attached to the lower end of the filter element 410. The filter element 410 having the ring 490 attached can now be placed into a filtration device. Although not illustrated, the ceramic filter element can have a composite infiltrated end and a metal ring attached to both ends of the filter element.

The sealed filter element according to the present invention provides a number of advantages over the prior art. The metal ring is hermetically attached to the filter element without the need for organic o-rings or other similar techniques that may leak due to gaps in the seal. The seal according to the present invention will work for a wide variety of filtration devices including those devices used for separating particles in the ultrafiltration range. Further, the operating temperature will only be limited by the melting temperature of the metal infiltrated into the ceramic and by the braze melting temperature, if applicable.

In another embodiment of the present invention, before, during or after the step of cooling the metal infiltrated filter element, a connecting means can be attached to the ceramic-metal composite portion of the filter element. In one embodiment, such a connecting means permits sealable attachment of the ceramic filter element to a dissimilar material. In another embodiment, such a connecting means permits sealable attachment of one ceramic filter element to another ceramic filter element.

In general, it is desirable to use ceramic filters under extreme conditions such as aggressive chemical environments (e.g., caustic or corrosive environments) and high temperatures, because ceramic filters are more durable, rugged, compact and do not require replacement for years compared to other membranes. Therefore, the ability to sealably attach a ceramic filter of the present invention (i.e., a ceramic filter having a ceramic-metal composite portion) to a dissimilar material, or to another ceramic filter at the ceramic-metal composite portion is desirable because such filters can be used in applications which involve such extreme conditions.

High temperature and aggressive chemical environments are typically problematic when using non-metal infiltrated ceramic filters. For example, filtration under high temperatures can be problematic due to unequal thermal expansion between the ceramic filter element and the manifold (e.g., typically metal) to which the filter is attached. Unequal, or mismatched, thermal expansion can result in cracking of the ceramic filter. Another condition which is problematic when using non-metal infiltrated ceramic filters is filtration of corrosive or caustic materials, wherein the filter seals may breach due to contact with the corrosive or caustic material. The ceramic filter element of the present invention overcomes these problems because the connecting means can be a metal that is resistant to problems associated with high temperature and aggressive chemicals. The connecting means sealably attaches the filter to a dissimilar material or to another filter at the ceramic-metal composite portion of the filter. The infiltrated metal strengthens the connection and improves the ability of the connection to withstand thermal expansion and/or the filtration of caustic materials. In addition, because of the strength and compliance of the ceramic-metal composite portion of the filter, a variety of connecting means can be used with a metal-infiltrated ceramic filter of the present invention that might cause a non-infiltrated ceramic to crack or otherwise fail.

According to the present invention, a connecting means can include any suitable means for attaching a ceramic filter element to a dissimilar material, or to another ceramic filter element. Preferred connecting means include, but are not limited to, a swage fitting, a compression fitting, a weld, a braze, a metal bellows and/or metal threads which are formed on the ceramic metal composite portion of the filter and combinations thereof. Several of these connecting means are discussed in detail below.

The connecting means can attach a ceramic filter element to a dissimilar material or to another ceramic filter element in a variety of configurations. For example, in one embodiment, illustrated in FIG. 5A, several ceramic filter elements 510 can be attached to a tube sheet header 520 of a filtration device. In this embodiment, the ceramic-metal composite portions 530 of a plurality of metal-infiltrated ceramic filter elements 510, each having a single channel, are attached to a tube sheet header 520 by a connecting means (not shown in this figure) as discussed below.

Figure 5B:
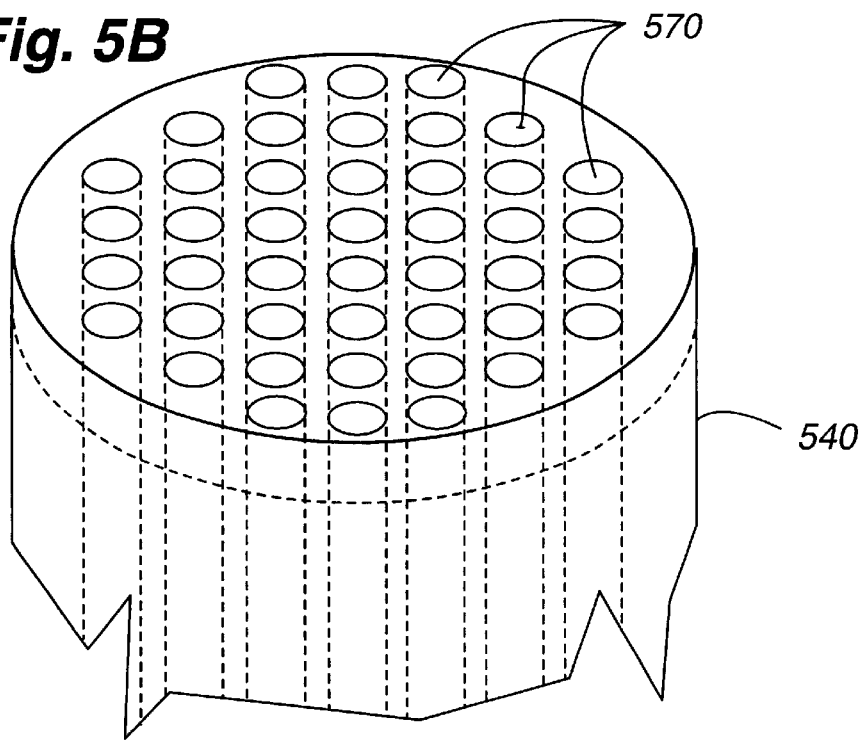
FIG. 5B illustrates a cylindrical housing that contains a plurality of ceramic filter elements according to one embodiment of the present invention which are connected to a tube sheet header.

In another embodiment, illustrated in FIG. 5B, a plurality of ceramic filter elements 510 are connected to a header 520 as shown in FIG. 5A, and the entire unit is contained within a housing 540. In this embodiment, the housing 540 is connected at the top to an inlet (not shown) and at the bottom to an outlet (not shown). The filtrant enters from the inlet, passes into the channels 570 of the ceramic filters, passes through the channels such that the permeate filters out of the open porosity of the ceramic and the concentrate exits the ceramic filter into the outlet at the bottom of the housing.

Figure 11:
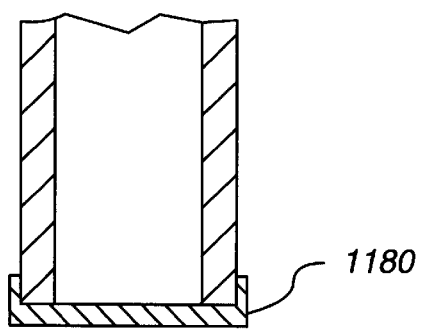
FIG. 11 illustrates a ceramic filter element that is sealed at one end with a metal cap according to one embodiment of the present invention.

Alternatively, the bottom of a ceramic filter can be sealed by a cap 1180, as illustrated in FIG. 11, so that the entire filtrant exits the filter as a permeate. A cap can be connected to the ceramic-metal composite portion of a ceramic filter, for example, by welding or brazing the cap onto the metal infiltrated end.

In another embodiment, the ceramic-metal composite portion of a metal-infiltrated ceramic filter element has a plurality of channels that run through the length of the filter element and are substantially parallel to the longitudinal axis of the filter and to one another. The filter is attached to a dissimilar material or to another ceramic filter element by a connecting means as described herein.

In yet another embodiment, the ceramic-metal composite portion of two single channel, metal-infiltrated ceramic filter units are attached to each other (e.g., end to end) by a connecting means. The point of attachment between the two filters can form a joint. A joint can be any type of joint, including a butt joint or a lap joint. Connecting means which can be used to form these particular joints are described in detail below.

Figure 6:
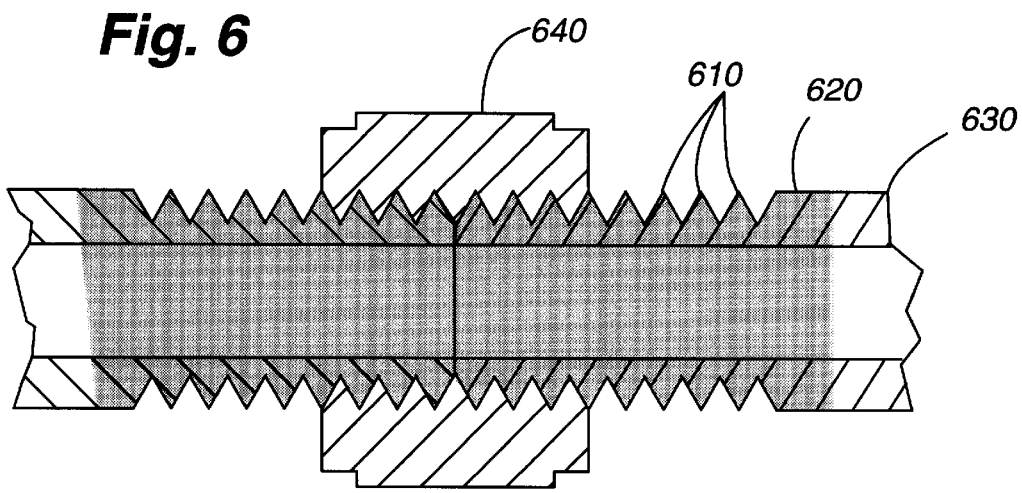
FIG. 6 illustrates a joint between two ceramic filter elements that is formed by a thread connection according to one embodiment of the present invention.

In one embodiment, a connecting means suitable for use in the present invention comprises threads. As illustrated in FIG. 6, the threads 610 are typically machined into the ceramic-metal composite portion 620 of the ceramic filter element 630 so that the ceramic filter element can be threadably connected (e.g., screwed) into another threaded member 640. One advantage of the infiltrated ceramic filter of the present invention is that the ceramic-metal composite portion behaves like a metal in some respects, allowing the machining of threads into the composite. Alternatively, the threads can be formed on top of the composite portion. In one embodiment of this aspect of the present invention, the ceramic-metal composite portion of the ceramic filter is at least about 25% by weight metal. Alternatively, the threads may be formed into the green ceramic body prior to firing or machined into the green ceramic body or the sintered ceramic body, all prior to metal infiltration.

Figure 7:
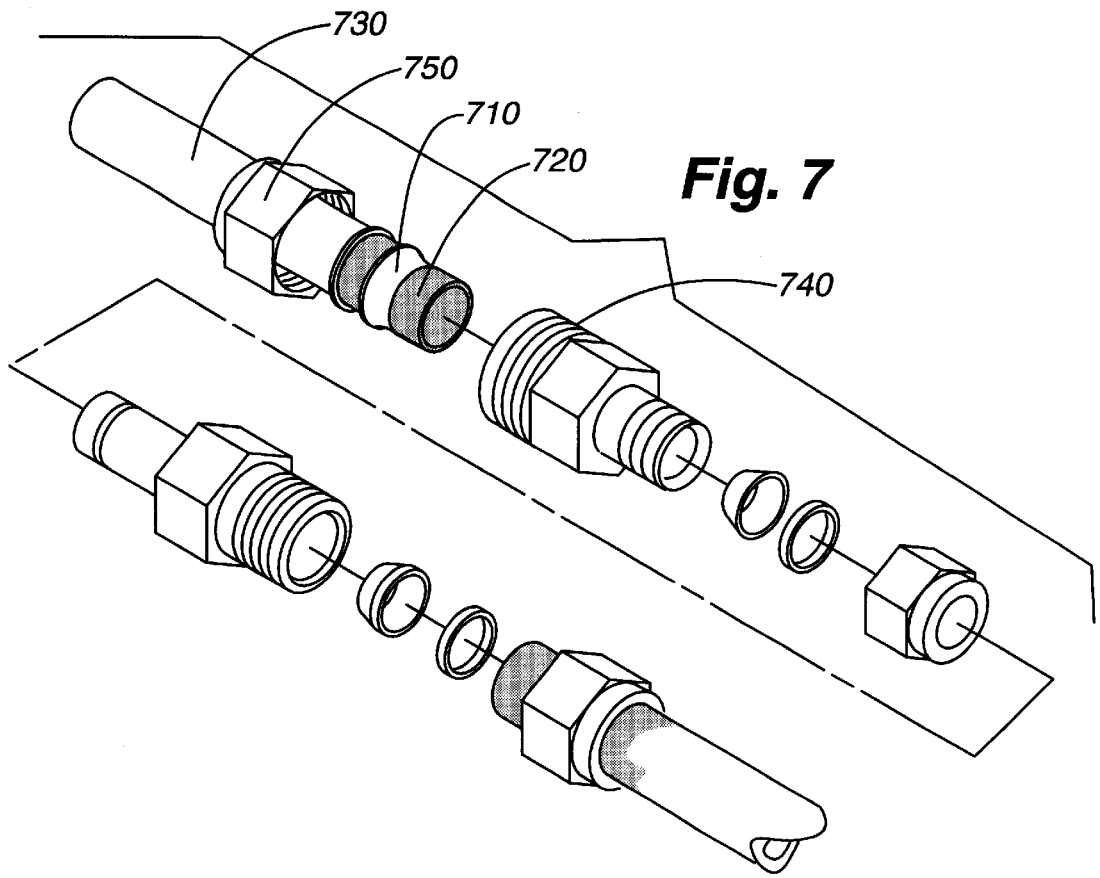
FIG. 7 illustrates a joint between two ceramic filter elements having a swage fitting connection according to one embodiment of the present invention.

In another embodiment of the present invention, a connection means can be a swage fitting. Swage fittings may not be suitable for use with non-metal-infiltrated ceramics, because the pressure created by applying such fittings may cause the ceramic to crack or otherwise fail. This is because ceramics typically have little or no compliance. The metal infiltrated ceramic of the present invention, however, is well suited to the use of a swage fitting, because the ceramic-metal composite portion has suitable compliance to accept the pressure applied by a swage fitting. In other words, the ceramic-metal portion has both the strength and the compliance to accept the pressure applied by the fitting without cracking or breaking. As illustrated in FIG. 7, in this embodiment, the compression ring 710 of a swage fitting is placed around the ceramic-metal composite portion 720 of a metal infiltrated ceramic filter 730. A male bolt portion 740 of the swage fitting is then threadably connected to a female nut portion 750 of the swage fitting over the compression ring 710 such that the compression ring 710 is compressed onto the ceramic-metal composite portion 720, the entire swage fitting forming a tight seal with the filter. The swage fitting can then be attached to another swage fitting which is connected to a second ceramic filter, for example, or to another component, such as a tube. A swage fitting can be made of brass or stainless steel, although other materials may be suitable.

In another embodiment of the present invention, a connecting means can be a braze. Examples of brazing and materials suitable therefor have been previously described herein. Brazing can be used to attach a metal member or another ceramic filter to the ceramic-metal composite portion of a ceramic filter element. For example, as described above, a metal seal ring can be attached to the perimeter of the ceramic-metal composite portion of a filter. The step of brazing can be performed using any suitable brazing metal (e.g., a high-temperature solder). Preferred brazing metals include, but are not limited to, a copper-silver eutectic brazing alloy or a silver alloy. In one embodiment, a ceramic filter element to be brazed is infiltrated with copper, and then plated with nickel prior to the brazing process.

Figure 8:
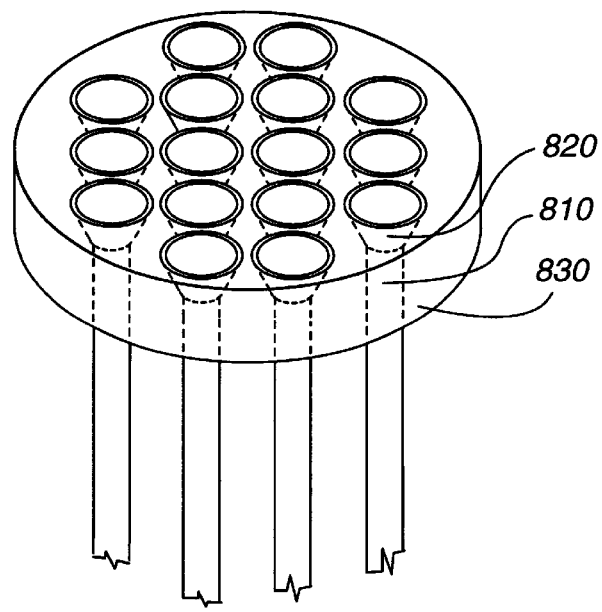
FIG. 8 illustrates a plurality of ceramic filter elements that are attached to a tube sheet header by a brazed ring connection means that has been flared into the header to form a wedge seal according to one embodiment of the present invention.

In another embodiment of the present invention, a connecting means can include brazing a ring onto the ceramic-metal composite portion of the end of a ceramic filter element. Such a ring can be used to connect or seal the ceramic filter to another component. For example, as illustrated in FIG. 8, the end of a metal-infiltrated ceramic filter 810 having a ring 820 brazed thereon can be inserted into a header 830. The ring 820 can then be expanded (e.g., flared) into the header 830 to form a wedge shape that sealably connects the ceramic filter to the header. This can be accomplished, for example, by using a tapered mandril to shape the ring (e.g., hydroexpansion). The ring can be made of any suitable metal, preferably from Kovar™, carbon steel, or stainless steel.

Figure 9A:
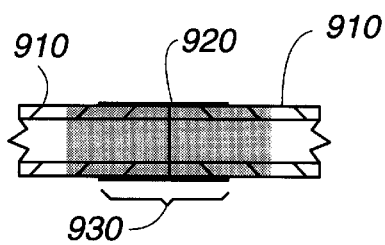
FIG. 9A illustrates two ceramic filter elements of the present invention which are attached by a butt joint according to one embodiment of the present invention.
Figure 9B:
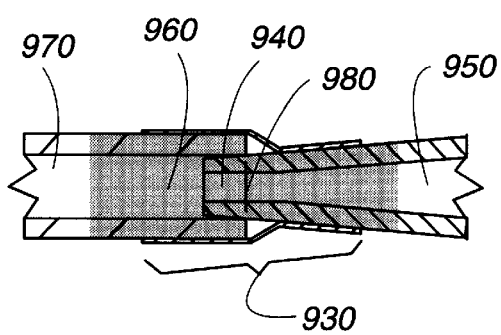
FIG. 9B illustrates a tapered fit lap joint between two ceramic filter elements of the present invention.

In another embodiment, the connecting means is a weld. According to the present invention, a weld is a fusing together of metal to form a joint. The weld can attach the ceramic-metal portion to a metal member. Such a metal member can be any member (e.g., a manifold) which is formed substantially of metal. Alternatively, a weld can attach the ceramic-metal portion of one ceramic filter element to the ceramic-metal portion of another ceramic filter element. As illustrated in FIG. 9A, the ends of two filter elements 910 can be welded flush together, for example, to form a butt joint 920. The joint can optionally be further strengthened by brazing a ring 930 around the circumference of the filters at the joint. It is to be understood that a butt joint can also be formed by brazing, instead of welding, the metal infiltrated ends of two filters together. The ceramic-metal composite portion of the a filter element can also be welded to another filter element by formation of a lap joint between the ceramic-metal portions of the filters. As illustrated in FIG. 9B, such a joint can be formed, for example, by forming a tapered fit between two filter elements. In this embodiment, one metal infiltrated end 940 of a first ceramic filter 950 is tapered to fit inside the channel 960 at the metal infiltrated end of a second infiltrated ceramic filter 970. The first filter 950 is compressed inside the second filter 970 until a tight fit is achieved. As for a butt joint, the lap joint 980 formed by the two filters can be further strengthened, if desired, by brazing a ring 930 around the circumference of the filters at the lap joint 980. Alternatively, a lap joint can be formed between the ceramic-metal composite ends of two metal infiltrated ceramic filter units by press fitting the two filters together (not shown). In this embodiment, the external diameter of one filter is the essentially the same as the internal diameter of a second filter, and the end of the first filter is forced inside the channel of the second filter to form a lap joint.

Figure 10A:
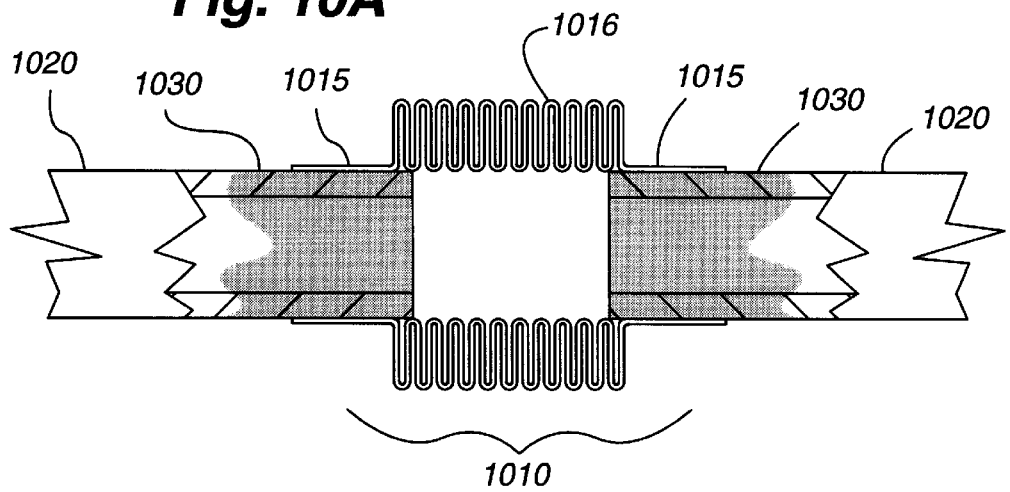
FIG. 10A illustrates two ceramic filter elements of the present invention that are joined by a metal bellows connection according to one embodiment of the present invention.
Figure 10B:
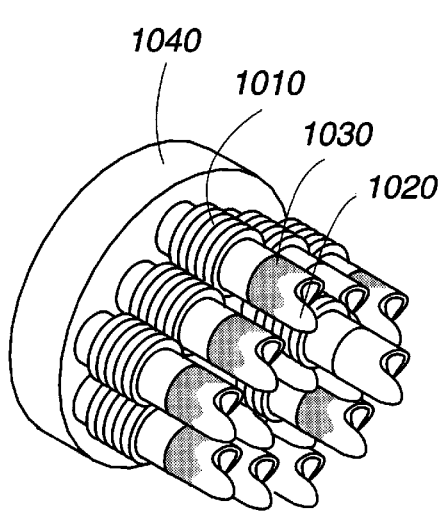
FIG. 10B illustrates the use of metal bellows to connect ceramic filter elements of the present invention to a tube sheet header.
Figure 10C:
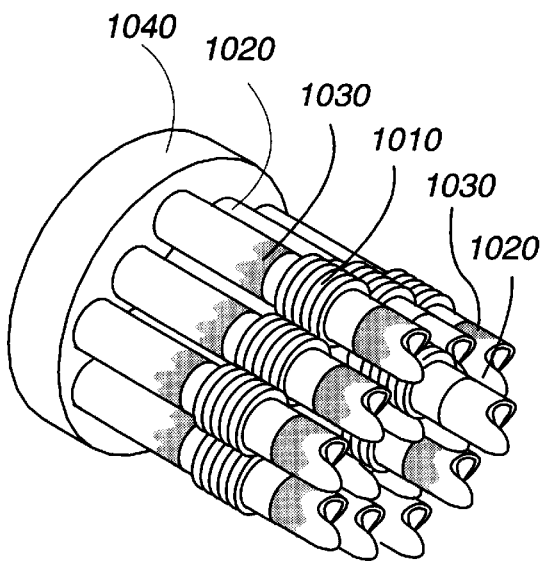
FIG. 10C illustrates the use of metal bellows to connect ceramic filter elements of the present invention to each other end to end.

Another type of connecting means of the present invention is an expansion bellows, or metal bellows. A metal bellows is particularly useful for ceramic filters which are to be used under extreme thermal conditions. In this situation, metal and ceramic have mismatched thermal expansion properties, and it is desirable to provide an expandable connecting means which can expand to avoid cracking or breaching at the ceramic joint. FIG. 10A illustrates a metal bellows which is used as a connecting means between two infiltrated ceramic filters of the present invention. In this embodiment, an end 1015 of a metal bellows 1010 can be attached to a ceramic filter 1020 by welding or brazing the end of the metal bellows 1010 to the ceramic-metal composite portion 1030 of the end of the filter. The other end of the metal bellows can be attached similarly to the ceramic-metal composite end of another ceramic filter. The central portion of the metal bellows 1016, which essentially forms the joint between the filters, is formed of expandable folds of metal that will allow the joint to expand under thermal conditions without damaging the connection between the ceramics and/or the ceramic and the metal bellows. In one embodiment of the present invention illustrated in FIG. 10B, an infiltrated ceramic filter 1020 can be attached by its ceramic-metal composite portion 1030 to a dissimilar material such as a header 1040 by a metal bellows connection means 1010. As illustrated in FIG. 10C, two or more filters 1020 can be connected end to end using metal bellows 1010, providing a strong, yet flexible filter unit that can withstand extreme thermal conditions. Finally, if the ceramic filter is contained within a metal housing, as illustrated in FIG. 5B, a portion of the housing can include a bellows portion (not shown) which extends around the circumference of the housing and allows the housing to expand and contract as necessary to accommodate the thermal expansion differences between the ceramic filter and the metal housing.

EXAMPLE

A porous support for a ceramic filter element having an apparent porosity of about 40 volume percent and a pore diameter range of from about 6 micrometers to about 10 micrometers is provided. The porous support is alumina and the channels are coated with an alumina membrane for separation of particles in the 0.2 to 0.8 micrometer size range. The filter element is cylindrical with 12 channels running the length of the cylinder. The cylinder has a diameter of about 1 inch (2.5 centimeters) and a length of about 39 inches (100 centimeters).

A molten metal bath is prepared for infiltrating into the filter element. The metal comprises copper metal and includes 3 weight percent copper oxide as an infiltration enhancer. The metal is heated to about 1275° C. until the metal is molten. While under a vacuum, the filter element is heated to about 1275° C. and one end of the filter element is contacted with the metal bath for less than one minute and the copper infiltrates that end of the filter to a height of about 1 inch (2.5 centimeters).

The filter element is then cooled to solidify the copper metal and seal the end of the filter element. Thereafter, a stainless steel ring is brazed onto the end of the filter using a copper/silver braze having about 30 weight percent silver.

While various embodiments of the present invention have been described in detail, it is apparent that modifications and adaptations of those embodiments will occur to those skilled in the art. For example, although porous ceramic filter elements have been described extensively throughout the specification, it is to be understood that other porous ceramics can be substituted therefor. It is to be expressly understood that such modifications and adaptations are within the spirit and scope of the present invention.

What is claimed is:

1. A method for sealing an end of a ceramic filter element, comprising the steps of:
   (a) providing a porous ceramic filter element comprising a first end portion and a second end portion and comprising filtering channels therethrough wherein said filter element comprises a substantially continuous network of open porosity;
   (b) contacting a portion of said first end of said filter element with a molten metal comprising from about 1.5 weight percent to about 10 weight percent oxygen, to infiltrate said metal into the continuous network of open porosity in said first end portion of said filter element by capillary action without substantially infiltrating said filtering channels;
   (c) cooling said infiltrated portion to form a filter element having an internally sealed end comprising a ceramic-metal composite portion.

2. The method of claim 1, wherein said molten metal comprises copper metal.

3. The method of claim 1, wherein said ceramic filter element comprises a porous ceramic support having from about 30 volume percent to about 50 volume percent open porosity.

4. The method of claim 1, further comprising the step of coating at least a portion of said filtering channels with a membrane layer.

5. The method of claim 1, further comprising forming threads into said ceramic metal composite portion before or after metal infiltration.

6. The method of claim 5, wherein said membrane layer comprises three different layers.

7. The method of claim 1, further comprising attaching a connecting means to said ceramic-metal composite portion.

8. The method of claim 7, wherein said connecting means permits sealable attachment of said ceramic filter element to a dissimilar material.

9. The method of claim 7, wherein said connecting means permits sealable attachment of said ceramic filter element to another ceramic filter element.

10. The method of claim 7, wherein said connecting means comprises a swage fitting or a compression fitting.

11. The method of claim 7, wherein said connecting means is a braze.

12. The method of claim 7, wherein said connecting means comprises a metal bellows.

13. The method of claim 7, wherein said connecting means is a weld.

14. The method of claim 13, wherein said weld attaches said ceramic-metal composite portion to a metal member.

15. The method of claim 7, wherein said step of attaching said connecting means to said ceramic-metal composite portion comprises the step of brazing said connecting means to said ceramic-metal composite portion.

16. The method of claim 15, wherein said step of brazing said connecting means to said ceramic-metal composite is performed using a copper-silver brazing alloy.

17. The method of claim 7, wherein said connecting means comprises threads.

18. The method of claim 17, wherein said porous ceramic support has an average pore size of from about 0.01 micrometers to about 2 millimeters.

* * * * *